(12) United States Patent
Toyama et al.

(10) Patent No.: US 11,457,548 B2
(45) Date of Patent: Sep. 27, 2022

(54) ELECTRONIC CONTROL DEVICE

(71) Applicant: Hitachi Automotive Systems, Ltd., Hitachinaka (JP)

(72) Inventors: Masahiro Toyama, Tokyo (JP); Isao Hoda, Tokyo (JP); Umberto Paoletti, Tokyo (JP); Hideyuki Sakamoto, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 16 days.

(21) Appl. No.: 17/268,168

(22) PCT Filed: Jun. 28, 2019

(86) PCT No.: PCT/JP2019/025904
§ 371 (c)(1),
(2) Date: Feb. 12, 2021

(87) PCT Pub. No.: WO2020/066192
PCT Pub. Date: Apr. 2, 2020

(65) Prior Publication Data
US 2021/0307216 A1  Sep. 30, 2021

(30) Foreign Application Priority Data

Sep. 25, 2018 (JP) .............................. JP2018-179488

(51) Int. Cl.
*H05K 7/02* (2006.01)
*H05K 7/04* (2006.01)
(Continued)

(52) U.S. Cl.
CPC ......... *H05K 9/0007* (2013.01); *H05K 5/0017* (2013.01); *H05K 5/0217* (2013.01)

(58) Field of Classification Search
USPC ................ 361/807, 728, 760, 799, 809, 810
See application file for complete search history.

(56) References Cited

U.S. PATENT DOCUMENTS 5,717,359 A * 2/1998 Matsui ................. H03H 7/0115
                                                      333/156
5,841,202 A * 11/1998 Noguchi .............. H05K 9/0066
                                                      257/528
(Continued)

FOREIGN PATENT DOCUMENTS

| JP | 10-190166 A | 7/1998 |
| JP | 2005-294627 A | 10/2005 |
| JP | 2009-248635 A | 10/2009 |

OTHER PUBLICATIONS

International Search Report (PCT/ISA/210) issued in PCT Application No. PCT/JP2019/025904 dated Sep. 24, 2019 with English translation (three (3) pages).

(Continued)

*Primary Examiner* — Hung S. Bui
(74) *Attorney, Agent, or Firm* — Crowell & Moring LLP (57) ABSTRACT

An electronic control device includes: a housing accommodating a board on which an electronic component is mounted; and a guard pattern formed on an outer peripheral portion of the board. The guard pattern and a ground pattern of a circuit in the circuit board are connected to each other in a vicinity of an intermediate point of fixed positions where an upper portion of the housing and a lower portion of the housing are fixed to each other.

12 Claims, 11 Drawing Sheets

(51) Int. Cl.
*H05K 9/00* (2006.01)
*H05K 5/00* (2006.01)
*H05K 5/02* (2006.01)

(56) References Cited

U.S. PATENT DOCUMENTS

| | | | |
|---|---|---|---|
| 6,016,084 A | 1/2000 | Sugimoto | |
| 6,480,395 B1 * | 11/2002 | Kopf | H05K 1/186 |
| | | | 361/720 |
| 8,670,240 B2 * | 3/2014 | Hashimoto | H05K 7/20481 |
| | | | 361/752 |

OTHER PUBLICATIONS

Japanese-language Written Opinion (PCT/ISA/237) issued in PCT Application No. PCT/JP2019/025904 dated Sep. 24, 2019 (four (4) pages).

* cited by examiner

ELECTRONIC CONTROL DEVICE

TECHNICAL FIELD

The present invention relates to an electronic control device.

BACKGROUND ART

In order to realize a driving assist system such as a collision damage reduction brake, automatic driving, etc., computing power required for an electronic control device of an automobile is increasing. Therefore, the electronic control device needs to be mounted with a semiconductor chip having a high operating frequency.

As a result, unnecessary electromagnetic radiation from the electronic control device is increased. In order to prevent the unnecessary electromagnetic radiation, a structure in which a printed circuit board on which the semiconductor chip is mounted is covered using a metal housing or a shield is effective, as is generally done in an information device, etc. However, since a space formed between the metal housing and the printed circuit board acts as a resonator in a certain frequency range, the unnecessary electromagnetic radiation is generated in the frequency range. In addition, since the same resonance occurs with respect to noise entering from outside, it is easily influenced by external noise.

PTL 1 describes a shield structure in which a plurality of connection portions that connect a housing and a printed circuit board are provided in a vicinity of a periphery of an electronic component to reduce noise.

CITATION LIST

Patent Literature

PTL 1: JP-A-2005-294627

SUMMARY OF INVENTION

Technical Problem

In the technique described in PTL 1, an influence of unnecessary electromagnetic radiation and external noise cannot be reduced without increasing the number of connection portions between the housing and the printed circuit board.

Solution to Problem

An electronic control device according to a first aspect of the invention is preferably an electronic control device including: a housing accommodating a board on which an electronic component is mounted; and a guard pattern formed on an outer peripheral portion of the board, in which the guard pattern and a ground pattern of a circuit in the board are connected to each other in a vicinity of an intermediate point of fixed positions where an upper portion of the housing and a lower portion of the housing are fixed to each other.

An electronic control device according to a second aspect of the invention is preferably an electronic control device including: a housing accommodating a board on which an electronic component is mounted; and a guard pattern formed on an outer peripheral portion of the board, in which the guard pattern and a ground pattern of a circuit in the board are connected to each other such that an electric field distribution of resonance generated by a side length of the board and an electric field distribution of resonance generated by a side length of the housing form opposite electric field distributions.

Advantageous Effect

According to the invention, it is possible to reduce an influence of unnecessary electromagnetic radiation and external noise without increasing the number of connection portions between a housing and a printed circuit board.

Problems, configurations, and effects other than those described above will be clarified by the following Description of Embodiments.

DESCRIPTION OF EMBODIMENTS

Hereinafter, embodiments of the invention present will be described with reference to the drawings. The following descriptions and drawings are examples for explaining the invention, and are appropriately omitted and simplified for clarification of the description. The invention can be implemented in various other forms. The number of constituent elements may be singular or plural, unless otherwise specified.

In order to facilitate understanding of the invention, a position, a size, a shape, a range, etc. of each constituent element shown in the drawings may not represent an actual position, size, shape, range, etc. Therefore, the invention is not necessarily limited to the position, size, shape, range, etc. disclosed in the drawings.

COMPARATIVE EXAMPLE

Figure 1:
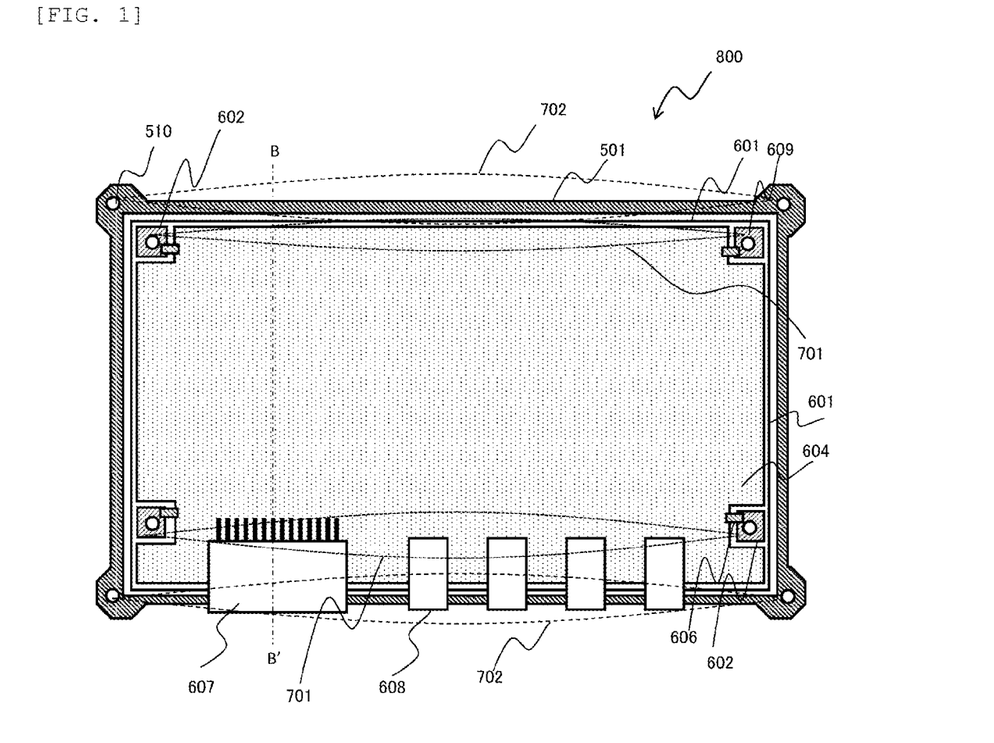
FIG. 1 is a top view of an electronic control device according to a comparative example.
Figure 2:
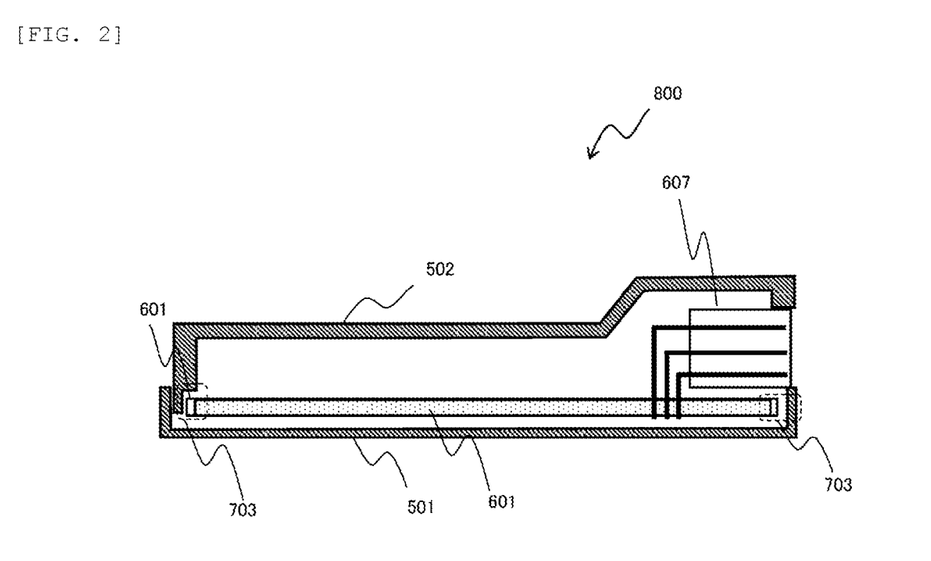
FIG. 2 is a cross-sectional view of the electronic control device according to the comparative example.

An in-vehicle electronic control device as a comparative example of the present embodiment will be described with reference to FIGS. 1 and 2. FIG. 1 is a top view of an electronic control device 800 with an upper portion 502 of a housing removed. FIG. 2 is a cross-sectional view of the electronic control device 800 taken along a line B-B' in FIG. 1.

As shown in FIG. 2, a printed circuit board 601 is accommodated in a housing in a manner of being sandwiched between a lower portion 501 of the housing and the upper portion 502 of the housing. As shown in FIG. 1, the lower portion 501 of the housing is fixed to the upper portion 502 of the housing via screws passing through screw holes 510 provided at four corners.

The printed circuit board 601 is fixed to the upper portion 502 of the housing via screws passing through screw holes 609. On the printed circuit board 601, patterns 602 for making the screws conductive are formed around the screw holes, and are connected to a ground 604 in the board via capacitors 606. In order to simplify the illustration, mounted components on the printed circuit board 601, a signal wiring and a power supply wiring connecting the mounted components, etc. are omitted in FIGS. 1 and 2, but the ground 604 of the printed circuit board 601 is assigned to an inner layer and a surface layer of the printed circuit board 601 in which those wirings, etc. do not exist.

In order to effectively prevent an influence of mechanical vibration with the minimum number of screws, the screw holes 510 for fastening the lower portion 501 of the housing and the upper portion 502 of the housing, and the screw holes 609 for fixing the upper portion 502 of the housing and the printed circuit board 601 are disposed in a vicinity of the four corners, and the screw hole 510 and the screw hole 609 are necessarily disposed at positions close to each other.

A space formed by the upper portion 502 of the housing and the lower portion 501 of the housing acts as a cavity resonator and has a frequency. Electromagnetic waves easily concentrate on an outer peripheral portion where the upper and lower portions of the housing are close to each other, and resonance easily occurs. As an example, an electric field distribution 702 of resonance generated by a length of a long side of the housing is briefly shown in FIG. 1 by two curves. The farther the two curves are, the stronger electric field is. Since the upper and lower portions of the housing are electrically conductive to each other via the screws, each screw hole 510 acts as anode of standing waves in the resonance, and an antinode of the standing waves where the electric field is maximum appears at an intermediate point of each screw hole 510.

Further, a space sandwiched between the ground 604 in the printed circuit board 601 and the upper portion 502 of the housing also acts as a cavity resonator. Electromagnetic waves easily concentrate on a portion where the upper portion 502 of the housing and the ground 604 in the printed circuit board 601 are close to each other, and the resonance easily occurs. FIG. 1 shows an electric field distribution 701 of resonance generated by a length in a long side direction of the board. In the electric field distribution 701, a vicinity of the screw hole 609 serves as a node of the standing waves, and a vicinity of a center of the side acts as an antinode. At this time, a current flowing on the printed circuit board 601 due to the resonance is concentrated on portions, i.e., areas 703, each of which is a board end of the printed circuit board 601.

The electromagnetic waves generated by an operation of a semiconductor chip mounted on the printed circuit board 601 excite the resonance between the ground 604 in the printed circuit board 601 and the upper portion 502 of the housing, but since the antinode of the electric field at this time is close to the position of the antinode of the resonance standing waves of the upper and lower portions of the housing, the resonance between the upper and lower portions of the housing is also excited. A part of the electric field between the upper and lower portions of the housing leaks to outside of the housing from a gap between the upper and lower portions of the housing and resin portions of connectors 607 and 608, and is thus radiated to the outside. In addition, along a path on an opposite direction, external noise acts on components on the printed circuit board 601 and causes a malfunction.

In the present embodiment described below, an influence of such unnecessary electromagnetic radiation and external noise is reduced.

First Embodiment

Figure 3:
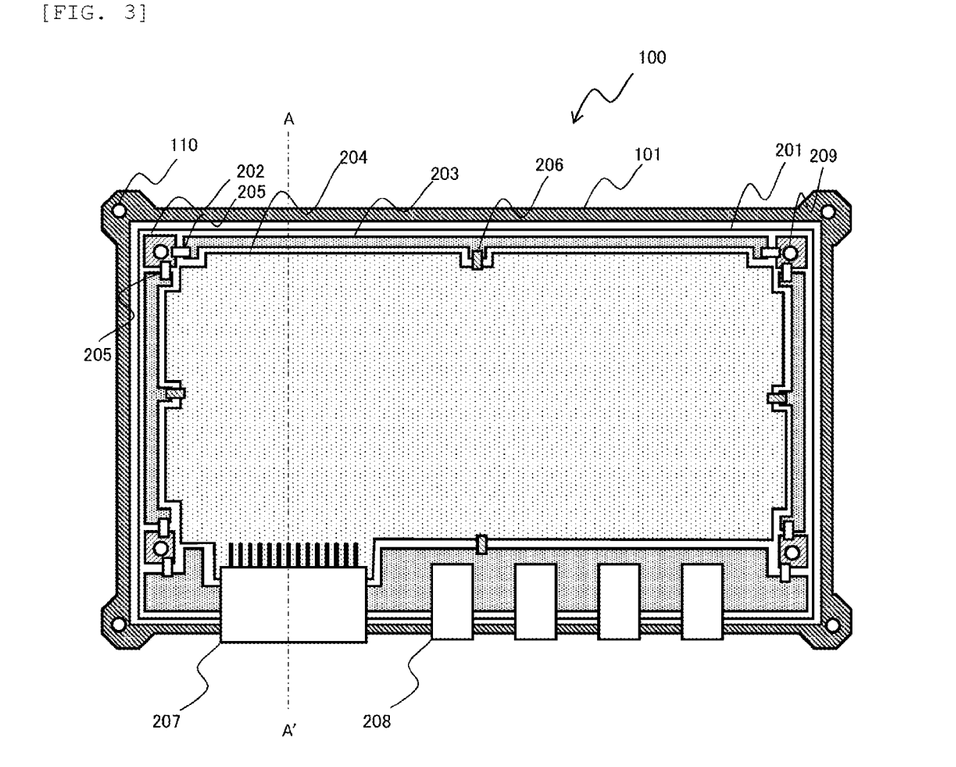
FIG. 3 is a top view of an electronic control device according to a first embodiment.

A first embodiment of the invention will be described with reference to FIGS. 3 to 5. FIG. 3 is a top view of an electronic control device 100 of the present embodiment with an upper portion 102 of the housing removed. FIG. 2 is a cross-sectional view taken along a line A-A' in FIG. 1. FIG. 5 shows an electric field distribution of an example of the resonance generated by the length of the long side of the electronic control device 100 on the top view. Regarding a pattern wiring in a printed circuit board 201, only a pattern wiring related to the present embodiment is described, and other electronic components, signal lines, power supply lines, etc. mounted on the printed circuit board 201 are not shown.

Figure 4:
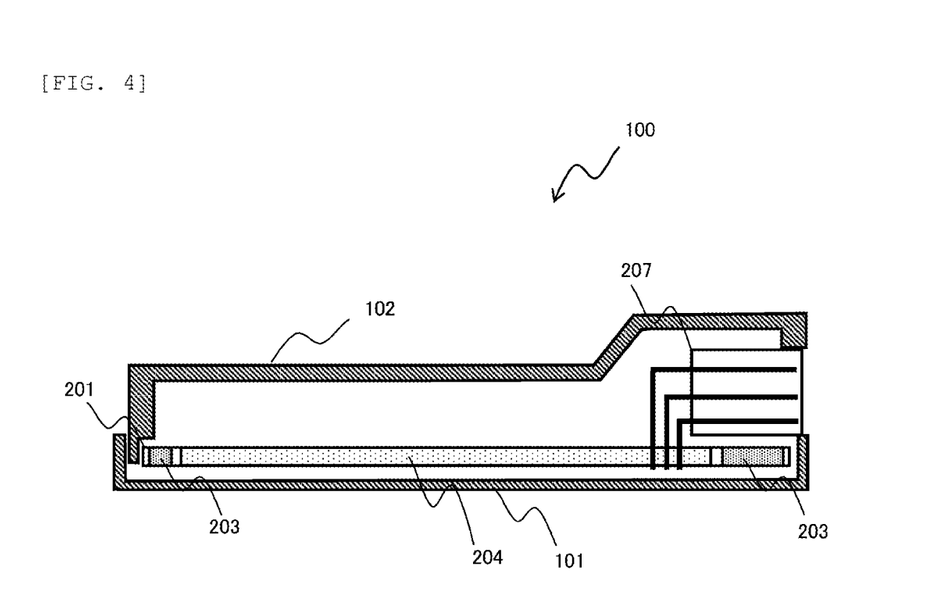
FIG. 4 is a cross-sectional view of the electronic control device according to the first embodiment.
Figure 5:
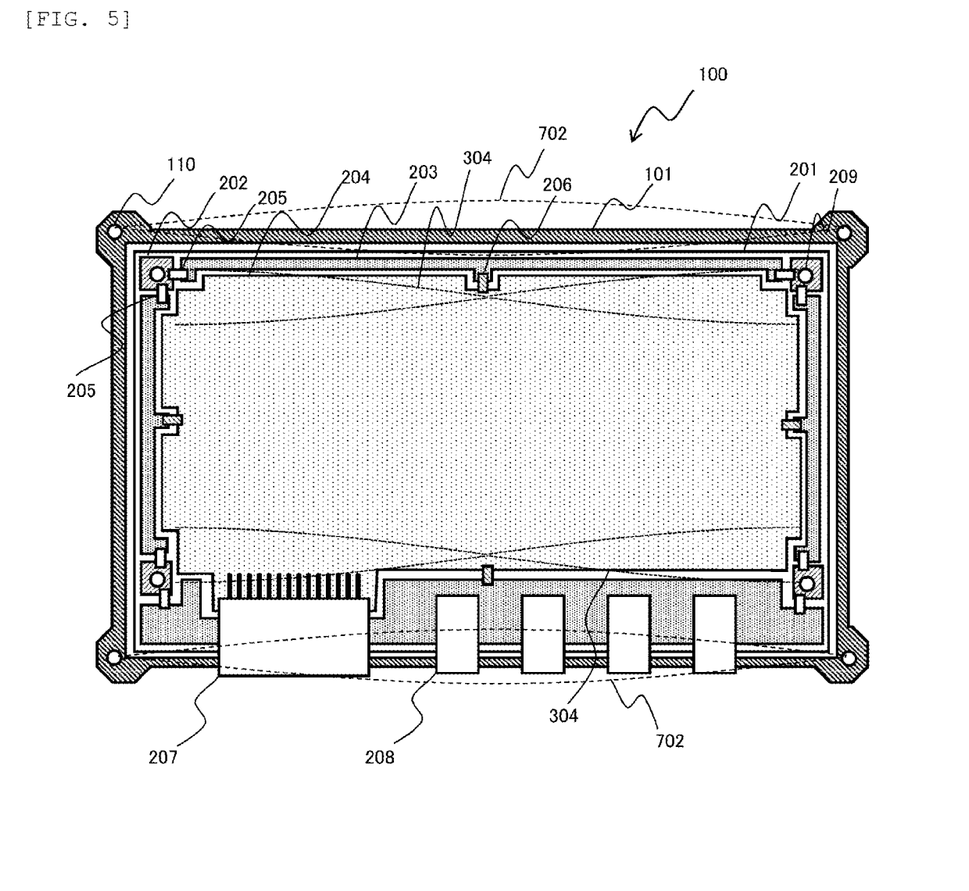
FIG. 5 shows an electric field distribution during resonance on the top view of the electronic control device according to the first embodiment.

As shown in FIG. 4, the printed circuit board 201 is disposed in a manner of being sandwiched between the upper portion 102 of a metal housing and a lower portion 101 of the metal housing. As shown in FIG. 3, the lower portion 101 of the housing is fixed to the upper portion 102 of the housing by screws passing through screw holes 110 at four corners, and the upper portion 102 of the housing and the lower portion 101 of the housing are made electrically conductive to each other via these screws. Screw holes 209 are disposed in the vicinity of the four corners on the printed circuit board 201, and the printed circuit board 201 is fixed to the upper portion 102 of the housing via the screws. Further, connection patterns 202 on the printed circuit board 201 are make electrically conductive to the upper portion 102 of the housing via these screws.

A guard pattern 203 is formed on an outer peripheral portion of the printed circuit board 201. The guard pattern 203 is provided on four peripheral sides of the printed circuit board 201 independently of a ground pattern 204 on the printed circuit board 201. The guard pattern 203 is connected to the connection pattern 202, which is made electrically conductive to the upper portion 102 of the housing, via a resistor 205. A resistance value of the resistor 205 is most effective to match a characteristic impedance of a conductor cross section formed by the guard pattern 203, the upper portion 102 of the housing, and the lower portion 101 of the housing from a viewpoint of resonance prevention, but may be a peripheral value thereof. As an example, a value of about 1Ω to 10Ω is selected. In addition, in the vicinity of a center of the guard pattern 203, that is, in the vicinity of an intermediate point between fixed positions (positions of the screw holes 110) where the upper portion 102 of the housing and the lower portion 101 of the housing are fixed to each other, conduction is made with the ground pattern 204 in the printed circuit board 201 via capacitors 206. In the present embodiment, the capacitor 206 is shown as an example, but a resistor may be provided instead of the capacitor 206, and the guard pattern 203 may be connected to the ground pattern 204 in the printed circuit board 201 via the resistor.

As described in the comparative example, a resonance current and the electric field between the printed circuit board and the housing are concentrated on the outer peripheral portion of the printed circuit board. In the present embodiment, a wiring pattern called the guard pattern 203 is formed in a portion where the resonance current and the electric field are concentrated, and the guard pattern 203 is separated from the ground pattern 204 in the printed circuit board 201 and then connected to the connection pattern 202 via the resistor 205. Accordingly, the resonance current flows through the resistor 205, so that effects of converting resonance energy into thermal energy and preventing electromagnetic radiation can be obtained.

Further, by providing a connection point with the ground pattern 204 in the printed circuit board 201 in the vicinity of the center of the guard pattern 203, as shown in an electric field distribution 304 in FIG. 5, resonance between the ground pattern 204 in the printed circuit board 201 and the housing has an electric field distribution in which the four corners are antinodes of the standing waves and the vicinity of the center of the side is a node instead.

Accordingly, the electric field distribution 304 of the resonance generated by the side length of the circuit board becomes an electric field distribution opposite to the electric field distribution 702 of the resonance generated by the side length of the housing, and the resonance between the ground pattern 204 in the printed circuit board 201 and the upper portion 102 of the housing hardly induces the resonance between the upper and lower portions of the housing, so that the effect of reducing the electromagnetic radiation is obtained.

The fixed position (position of the each screw hole 110) where the upper portion 102 of the housing and the lower portion 101 of the housing are fixed to each other may also be used as the screw hole 209 for fixing the printed circuit board 201 and the upper portion 102 of the housing via the screws, and the upper portion of the housing 102, the lower portion 101 of the housing, and the printed circuit board 201 may be fixed using one screw hole. In this case, the electric field distributions 304 and 702 are similar to those described above.

As described above, it is possible to reduce the influence of the unnecessary electromagnetic radiation and the external noise without increasing the number of conduction portions between the housing and the printed circuit board 201 via the screws, etc.

The capacitor 206 between the ground pattern 204 and the guard pattern 203 in the printed circuit board 201 may be added to a position other than the center of the side. However, due to the above-mentioned electric field distribution, a radiation prevention effect is higher when the capacitor 206 is disposed in the vicinity of the center of the side as much as possible.

Second Embodiment

Figure 6:
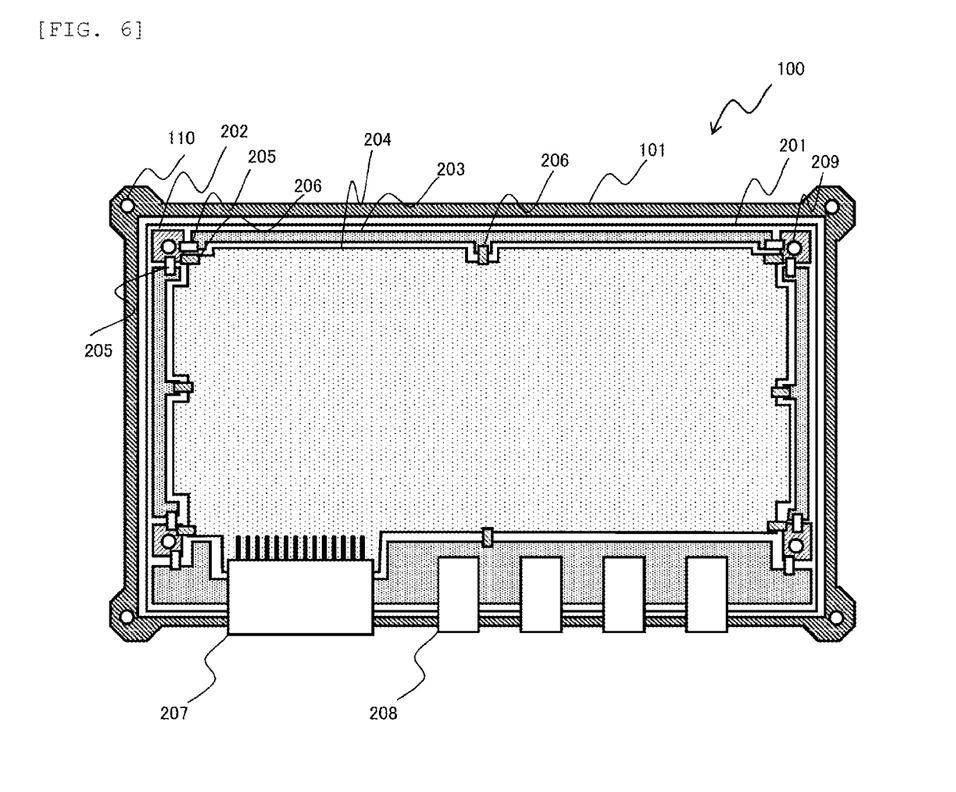
FIG. 6 is a top view of an electronic control device according to a second embodiment.

A second embodiment of the invention will be described with reference to FIG. 6. FIG. 6 is a top view of the electronic control device 100 of the present embodiment with the upper portion 102 of the housing removed. Since a cross-sectional structure of the present embodiment is the same as that of the first embodiment, an illustration is omitted. The same parts as those in the first embodiment are denoted by the same reference numerals, and descriptions thereof will be omitted.

The present embodiment is different from the first embodiment in that the capacitors 206 are inserted between the ground pattern 204 and the connection pattern 202 in the printed circuit board 201. In this way, regarding the electric field distribution during the resonance between the ground pattern 204 in the printed circuit board 201 and the upper portion 102 of the housing, the four corners of the printed circuit board 201 are also nodes. Further, since the guard pattern 203 and the ground pattern 204 are connected to each other via the capacitors 206 at the center of the side of the printed circuit board 201, a distribution is obtained, which is opposite to the electric field distribution, shown in the comparative example, in which the center of the side is also the node and the vicinity of the center of the side is the antinode. A resistor may be provided instead of the capacitor 206, and the guard pattern 203 may be connected to the ground pattern 204 in the printed circuit board 201 via the resistor.

In the present embodiment, the ground pattern 204 and the connection pattern 202 in the printed circuit board 201 have a path connected via the capacitor. Therefore, efficiency of converting resonance energy into the thermal energy is reduced, but in a case where it is necessary to promptly release to the housing static electricity entering the signal wiring, static electricity resistance can be further improved accordingly.

Third Embodiment

Figure 7:
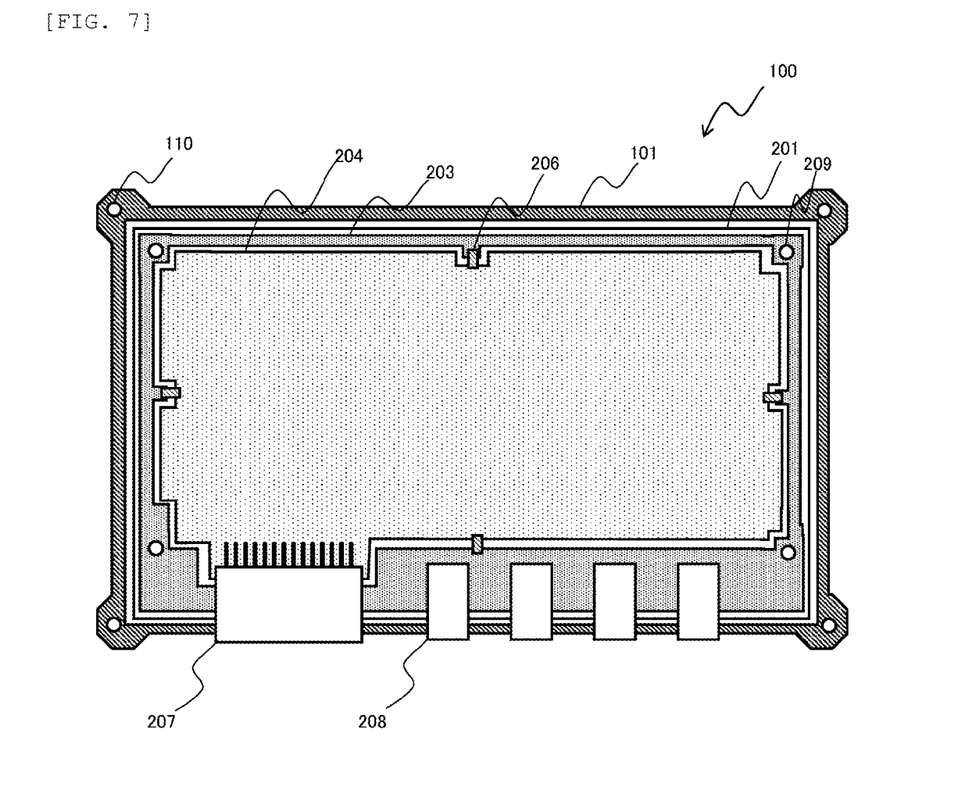
FIG. 7 is a top view of an electronic control device according to a third embodiment.

A third embodiment of the invention will be described with reference to FIG. 7. FIG. 7 is a top view of the electronic control device 100 of the present embodiment with the upper portion 102 of the housing removed. Since a cross-sectional structure of the present embodiment is the same as that of the first embodiment, an illustration is omitted. The same parts as those in the first embodiment are denoted by the same reference numerals, and descriptions thereof will be omitted.

In the first embodiment, the guard pattern 203 is connected to the connection pattern 202 via the resistor 205, but in the present embodiment, the guard pattern 203 provided on the outer peripheral portion of the printed circuit board 201 is continuously formed around the screw holes 209. In the present embodiment, the resonance energy cannot be converted into the thermal energy via the resistor 205 as shown in the first embodiment, but since an effect of shifting the electric field distribution of the resonance between the ground pattern 204 in the printed circuit board 201 and the upper portion 102 of the housing from the electric field distribution of the resonance between the upper and lower portions of the housing can be obtained, the effect of preventing the unnecessary electromagnetic radiation can be obtained.

In the present embodiment, by omitting the resistor 205 in the vicinity of each screw hole 209, there is an advantage that a degree of freedom in designing the printed circuit board 201 around the screw holes 209 can be increased.

Fourth Embodiment

Figure 8:
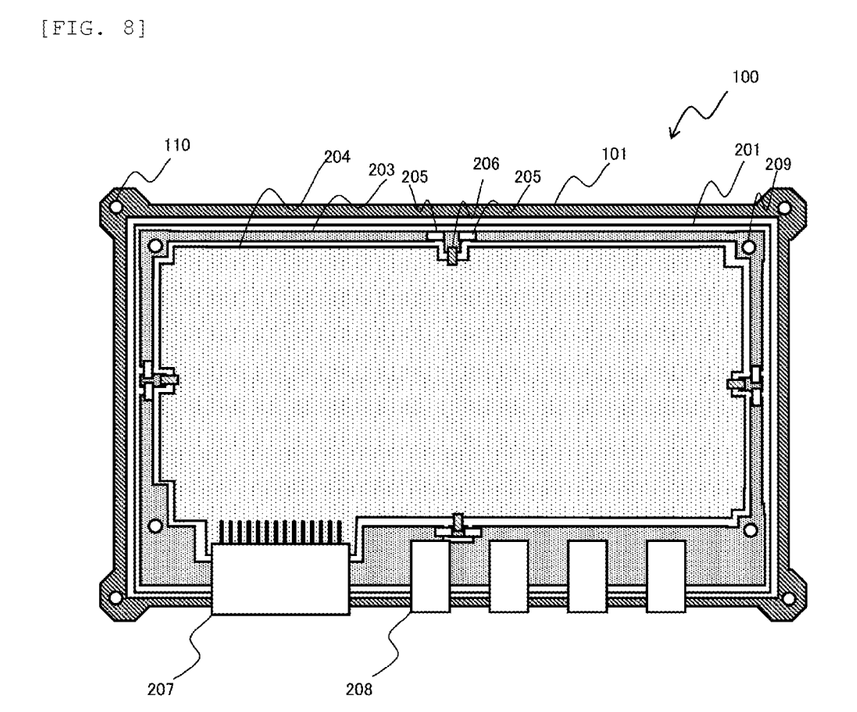
FIG. 8 is a top view of an electronic control device according to a fourth embodiment.

A fourth embodiment of the invention will be described with reference to FIG. 8. FIG. 8 is a top view of the electronic control device 100 of the present embodiment with the upper portion 102 of the housing removed. Since a cross-sectional structure of the present embodiment is the same as that of the first embodiment, an illustration is omitted. The same parts as those in the first embodiment are denoted by the same reference numerals, and descriptions thereof will be omitted.

In the first embodiment, the guard pattern 203 is connected to the connection pattern 202 via the resistor 205, but in the present embodiment, the guard pattern 203 provided on the outer peripheral portion of the printed circuit board 201 is continuously formed around the screw holes 209. Further, the guard pattern 203 is separated in the vicinity of the center of the side of the guard pattern 203, and the resistors 205 are inserted on both sides so as to connect separated guard patterns 203. The resistance value of the resistor 205 is most effective to match the characteristic impedance of the conductor cross section formed by the guard pattern 203, the upper portion 102 of the housing, and the lower portion 101 of the housing from the viewpoint of resonance prevention, but may be a peripheral value thereof. Further, a central portion of the separated guard patterns 203 and the ground pattern 204 are connected to each other via the capacitor 206. A resistor may be provided instead of the capacitor 206.

As in the first embodiment, with the resistors 205, the effect of converting the resonance energy into the thermal energy is obtained, and effects of shifting the electric field distribution of the resonance between the ground pattern 204 in the printed circuit board 201 and the upper portion 102 of the housing from the electric field distribution of the resonance between the upper and lower portions of the housing and preventing interlocking with each other is obtained.

According to the present embodiment, it is possible to cope with a case where circuits are densely packed in the vicinity of each screw hole 209 and it is difficult to add components. Depending on a circuit arrangement on the printed circuit board 201, a form as in the first embodiment or a form combined with the form of the present embodiment may be adopted.

Fifth Embodiment

Figure 9:
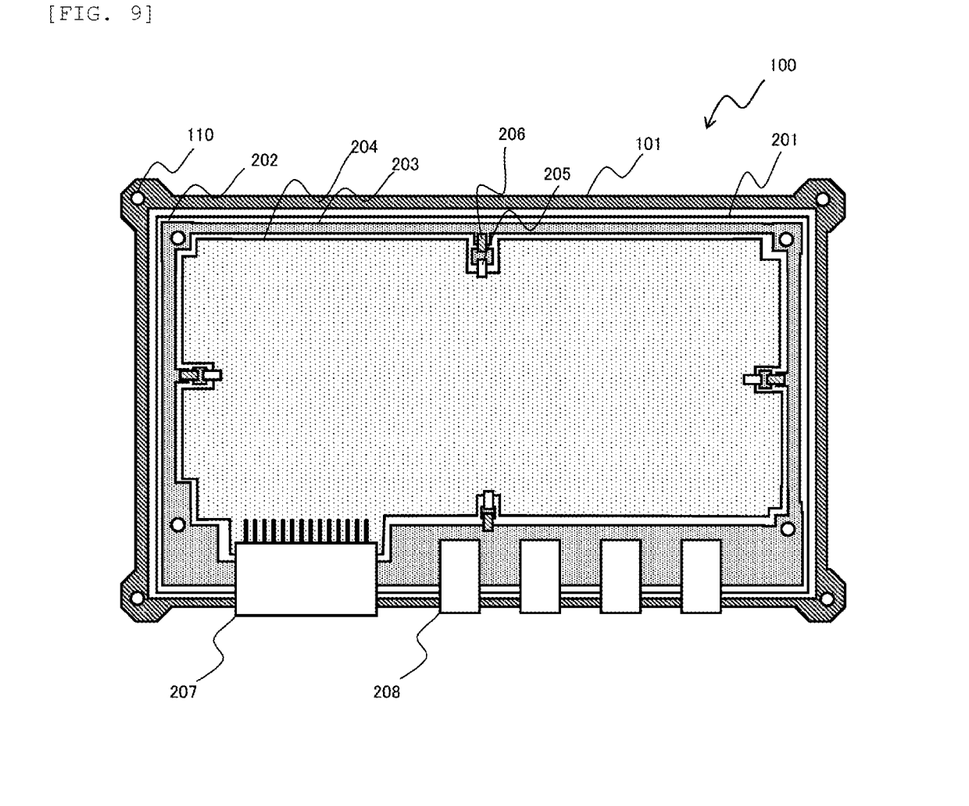
FIG. 9 is a top view of an electronic control device according to a fifth embodiment.

A fifth embodiment of the invention will be described with reference to FIG. 9. FIG. 9 is a top view of the electronic control device 100 of the present embodiment with the upper portion 102 of the housing removed. Since a cross-sectional structure of the present embodiment is the same as that of the first embodiment, an illustration is omitted. The same parts as those in the first embodiment are denoted by the same reference numerals, and descriptions thereof will be omitted.

In the present embodiment, as shown in the third embodiment, the guard pattern 203 provided on the outer peripheral portion of the printed circuit board 201 is continuously formed around the screw holes 209. Further, in the present embodiment, the capacitor 206 and the resistor 205 between the ground pattern 204 in the printed circuit board 201 and the guard pattern 203 are inserted and connected in series at the central portion of the side of the guard pattern 203. Accordingly, the effect of converting the resonance energy into the thermal energy is obtained.

Although in the present embodiment, the resonance of the guard pattern 203 alone cannot be prevented by the resistors 205 compared with the fourth embodiment, it is possible to increase the degree of freedom of board patterns in the printed circuit board 201 because the number of the resistors 205 can be reduced.

Sixth Embodiment

Figure 10:
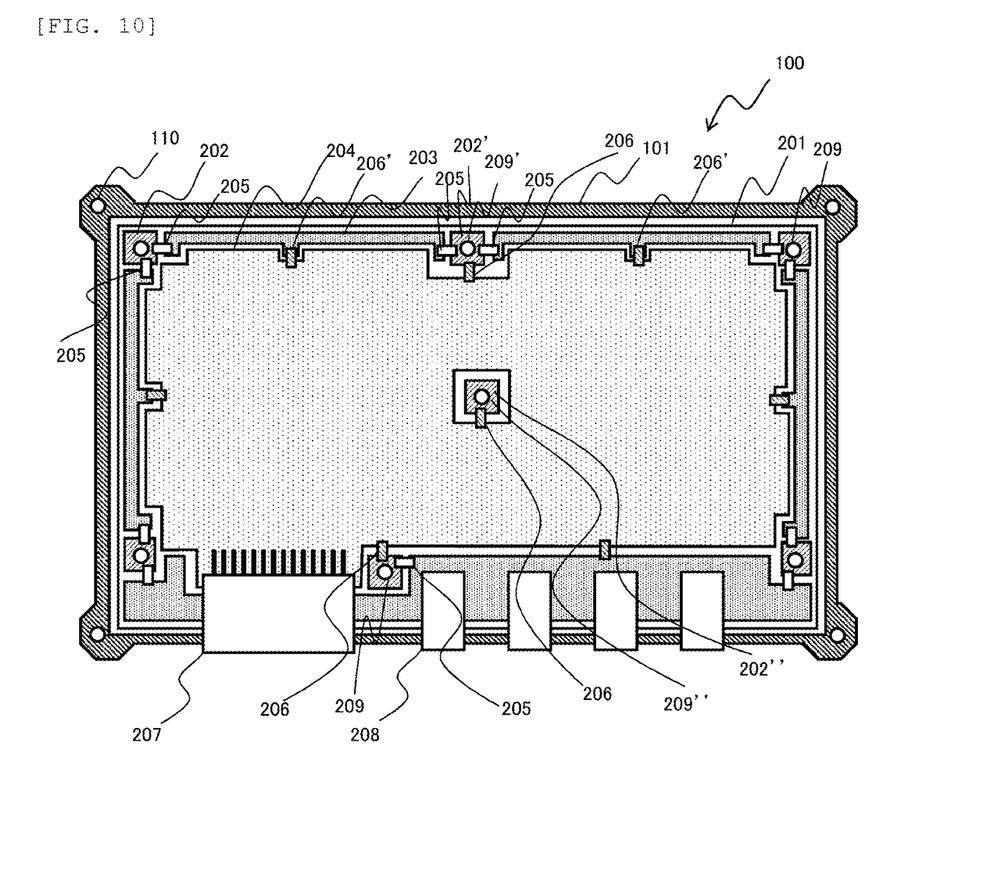
FIG. 10 is a top view of an electronic control device according to a sixth embodiment.

A sixth embodiment of the invention will be described with reference to FIG. 10. FIG. 10 is a top view of the electronic control device 100 of the present embodiment with the upper portion 102 of the housing removed. Since a cross-sectional structure of the present embodiment is the same as that of the first embodiment, an illustration is omitted. The same parts as those in the first embodiment are denoted by the same reference numerals, and descriptions thereof will be omitted.

The present embodiment is an embodiment in which the screw holes 209 for fixing the upper portion 102 of the housing and the printed circuit board 201 are disposed in addition to being disposed at the four corners of the printed circuit board 201. The present embodiment will be described in three cases depending on positions of the screw holes 209 for fixing the printed circuit board 201.

First, a case where the screw holes 209 are disposed at the four corners of the printed circuit board 201. The connection pattern 202 around each screw hole 209 for fixing the printed circuit board 201 and located near each screw hole 110 connecting the upper and lower portions of the housing is connected to the guard pattern 203 via the resistor 205 as in the first embodiment.

Second, a case where a screw hole 209' is disposed in the center of the side of the guard pattern 203. A connection pattern 202' of the screw hole 209' for fixing the printed circuit board 201 and disposed at a position (such as the center of the side of the guard pattern 203) away from each screw hole 110 connecting the upper and lower portions of the housing is connected to the ground pattern 204 in the printed circuit board 201 via the capacitor 206 in addition to being connected to the guard pattern 203 via the resistor 205. The screw hole 209' and the connection pattern 202' form a conductive portion configured to make the housing and the circuit board electrically conductive to each other by connecting to the upper portion 102 of the housing via the screws. Accordingly, the ground pattern 204 in the printed circuit board 201 and the upper portion 102 of the housing are connected to each other at the center of the side with impedance lower than that of the first embodiment, and an effect of forming a node of the electric field during the resonance between the ground pattern 204 in the printed circuit board 201 and the upper portion 102 of the housing is further obtained. Further, the distribution can be shifted from the distribution of the resonance between the upper and lower portions of the housing, and the radiation prevention effect is further improved.

In addition, in the present embodiment, capacitors 206' are added at intermediate points between the screw holes 209 such that the prevention effect can be obtained even for higher frequency resonance, but the capacitors 206' may not be provided.

Third, a screw hole 209" for fixing the printed circuit board 201 located in an area in the ground pattern 204 in the printed circuit board 201, which is far from the guard pattern 203, will be described. A connection pattern 202" of the screw hole 209" is connected to the ground pattern 204 in the printed circuit board 201 via the capacitor 206, and is not connected to the guard pattern 203. The screw hole 209" and the connection pattern 202" form a conductive portion configured to make the housing and the circuit board electrically conductive to each other by connecting to the upper portion 102 of the housing via the screws. The resonance is difficult to concentrate because it is not the outer periphery of the printed circuit board 201, but since a connection point between the ground pattern 204 in the printed circuit board 201 and the upper portion 102 of the housing is provided, in the electric field distribution of the resonance between the ground pattern 204 in the printed circuit board 201 and the upper portion 102 of the housing, the effect of forming a node and shifting the electric field distribution from the resonance of the upper and lower portions of the housing can be obtained.

An object of the invention is to prevent the unnecessary electromagnetic radiation with reduced number of screws. When using the invention after adding the screws, the effect of preventing radiation even in a higher frequency range can be obtained.

In the present embodiment, although the case where the screws for fixing the printed circuit board 201 are added is described based on the first embodiment, the prevention effect can be improved in the same manner when the screws are added based on the second to fifth embodiments.

Seventh Embodiment

Figure 11:
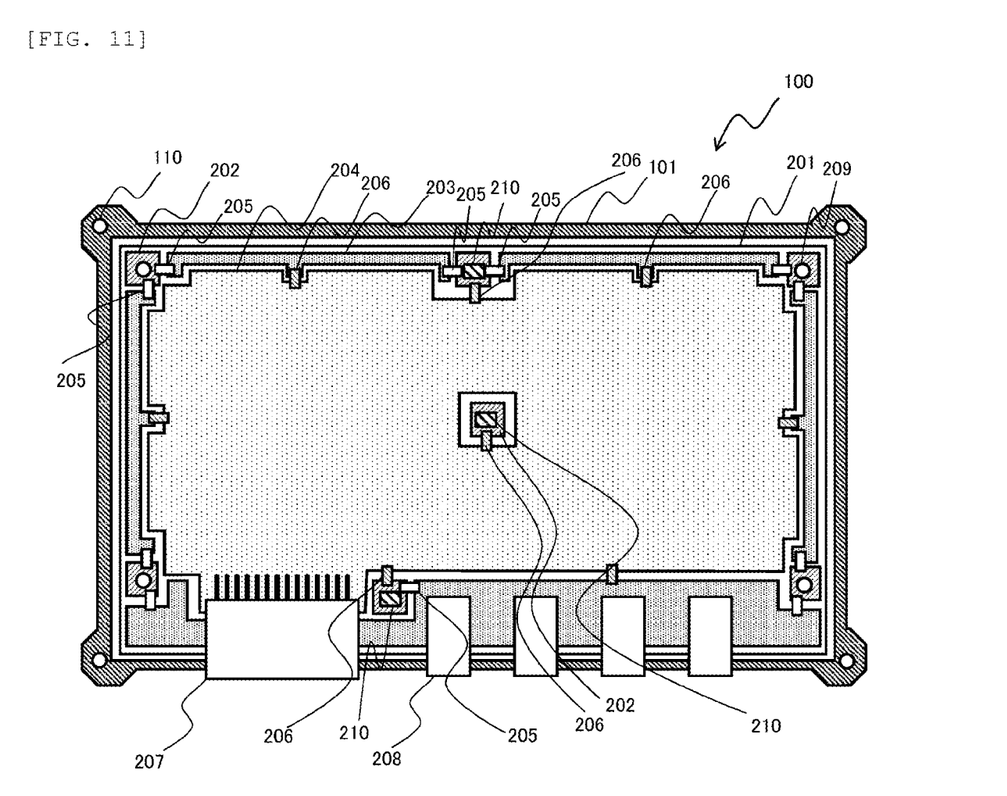
FIG. 11 is a top view of an electronic control device according to a seventh embodiment.

A seventh embodiment of the invention will be described with reference to FIG. 11. FIG. 11 is a top view of the electronic control device 100 of the present embodiment with the upper portion 102 of the housing removed. Since a cross-sectional structure of the present embodiment is the same as that of the first embodiment, an illustration is omitted. The same parts as those in the first embodiment are denoted by the same reference numerals, and descriptions thereof will be omitted.

The present embodiment has many parts in common with the sixth embodiment, but fixing screws for preventing the influence of mechanical vibration are disposed at the four corners, and connection points between the printed circuit board and the upper portion of the housing are implemented by conductive elastic members 210. That is, the conductive elastic member 210 is disposed on the connection pattern 202 disposed at the center of the side of the guard pattern 203, and the connection pattern 202 is connected to the ground pattern 204 in the printed circuit board 201 via the capacitor 206 in addition to being connected to the guard pattern 203 via the resistor 205. The conductive elastic member 210 is disposed on the connection pattern 202 in the printed circuit board 201 located in the area in the ground pattern 204 in the printed circuit board 201, and the connection pattern 202 is connected to the ground pattern 204 in the printed circuit board 201 via the capacitor 206. The conductive elastic member 210 is a conductive metal spring, an elastic body formed by applying a conductive material to the surface, etc.

According to the seventh embodiment, the radiation prevention effect can be obtained up to a high frequency band without increasing assembly man-hours due to adding the screws, as compared with the sixth embodiment.

According to the embodiments described above, the following operational effects are obtained.

(1) The electronic control device 100 includes: the housings 101 and 102 accommodating the printed circuit board 201 on which the electronic component is mounted; and the guard pattern 203 formed on the outer peripheral portion of the printed circuit board 201. The guard pattern 203 and the ground pattern 204 of the circuit in the printed circuit board 201 are connected to each other in the vicinity of the intermediate point of the fixed positions where the upper portion 102 of the housing and the lower portion 101 of the housing are fixed to each other. Accordingly, it is possible to reduce the influence of the unnecessary electromagnetic radiation and the external noise without increasing the number of connection portions between the housing and the printed circuit board.

(2) The electronic control device 100 includes: the housings 101 and 102 accommodating the printed circuit board 201 on which the electronic component is mounted; and the guard pattern 203 formed on the outer peripheral portion of the printed circuit board 201. The guard pattern 203 and the ground pattern 204 of the circuit in the printed circuit board 201 are connected to each other such that the electric field distribution 702 of the resonance generated by the side length of the printed circuit board 201 and the electric field distribution 304 of the resonance generated by the side lengths the housings 101 and 102 form opposite electric field distributions. Accordingly, the resonance between the ground pattern 204 in the printed circuit board 201 and the upper portion 102 of the housing hardly induces the resonance between the upper and lower portions of the housing, and the effect of reducing the electromagnetic radiation is obtained. Further, it is possible to reduce the influence of the unnecessary electromagnetic radiation and the external noise without increasing the number of connection portions between the housing and the printed circuit board.

The invention is not limited to the embodiments described above, and other embodiments conceivable within the scope of the technical idea of the invention are also included in the scope of the invention as long as the features of the invention are not impaired. In addition, the above-described embodiments may be configured to be combined.

A disclosed content of the following priority basic application is incorporated herein as reference.

Japanese Patent Application No. 2018-179488 (filed on Sep. 25, 2018)

REFERENCE SIGN LIST 100 electronic control device
101 lower portion of housing
102 upper portion of housing
110 screw hole for fixing upper and lower portions of housing
201 printed circuit board
202 connection pattern
203 guard pattern
204 ground pattern
205 resistor
206 capacitor
209 screw hole for fixing printed circuit board
210 conductive elastic member

The invention claimed is:

1. An electronic control device comprising:
a housing accommodating a board on which an electronic component is mounted, and
a guard pattern formed on an outer peripheral portion of the board, wherein
the guard pattern and a ground pattern of a circuit in the board are connected to each other in a vicinity of an intermediate point of fixed positions where an upper portion of the housing and a lower portion of the housing are fixed to each other; and
the guard pattern is separated at a central portion of a side thereof on the outer peripheral portion of the board, and the central portion of the guard pattern is connected to each separated guard pattern via a resistor, and is connected to the ground pattern via a first capacitor.

2. The electronic control device according to claim 1, wherein the guard pattern and the ground pattern are connected to each other via a capacitor in the vicinity of the intermediate point of the fixed positions where the upper portion of the housing and the lower portion of the housing are fixed to each other.

3. The electronic control device according to claim 1, wherein
the guard pattern and the ground pattern are connected to each other via a resistor in the vicinity of the intermediate point of the fixed positions where the upper portion of the housing and the lower portion of the housing are fixed to each other.

4. The electronic control device according to claim 3, wherein
a value of the resistor is selected so as to match a characteristic impedance determined by a conductor cross section formed by the guard pattern, the upper portion of the housing, and the lower portion of the housing.

5. The electronic control device according to claim 1, wherein
a connection pattern provided at the fixed position is connected to the guard pattern via the resistor.

6. The electronic control device according to claim 1, wherein
a connection pattern provided at the fixed position is connected to the ground pattern via the first capacitor.

7. The electronic control device according to claim 1, wherein
the guard pattern and the ground pattern of the circuit in the board are connected to each other via a resistor and the first capacitor which are in a series connection, in the vicinity of the intermediate point of the fixed positions where the upper portion of the housing and the lower portion of the housing are fixed to each other.

8. The electronic control device according to claim 1, further comprising:
a conductive portion configured to make the housing and the board conductive to each other at a position that is different from the fixed positions and on the outer peripheral portion of the board, wherein
the conductive portion is electrically connected to the guard pattern via a resistor, and the conductive portion is connected to the ground pattern via a second capacitor.

9. The electronic control device according to claim 8, wherein
the conductive portion is implemented by a screw configured to fix the housing and the board.

10. The electronic control device according to claim 8, wherein
the conductive portion is implemented by a conductive elastic member configured to make the housing and the board conductive to each other.

11. The electronic control device according to claim 1, further comprising:
a conductive portion configured to make the housing and the board conductive to each other at a position that is different from the fixed positions and not on the outer peripheral portion of the board, wherein
the conductive portion is connected to the ground pattern via a second capacitor.

12. An electronic control device comprising:
a housing accommodating a board on which an electronic component is mounted, and
a guard pattern formed on an outer peripheral portion of the board, wherein
the guard pattern and a ground pattern of a circuit in the board are connected to each other such that an electric field distribution of resonance generated by a side length of the board and an electric field distribution of resonance generated by a side length of the housing form opposite electric field distributions; and
the guard pattern is separated at a central portion of a side thereof on the outer peripheral portion of the board, and the central portion of the guard pattern is connected to each separated guard pattern via a resistor, and is connected to the ground pattern via a capacitor.

* * * * *